United States Patent
Gosla et al.

(10) Patent No.: US 8,788,880 B1
(45) Date of Patent: Jul. 22, 2014

(54) EFFICIENT RETRY MECHANISM FOR SOLID-STATE MEMORY FAILURES

(75) Inventors: Asif F. Gosla, Irvine, CA (US);
Chiranjeb Mondal, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 147 days.

(21) Appl. No.: 13/592,218

(22) Filed: Aug. 22, 2012

(51) Int. Cl.
*G06F 11/00* (2006.01)

(52) U.S. Cl.
USPC .......................................................... 714/16

(58) Field of Classification Search
USPC ....................................................... 714/1–57
See application file for complete search history.

(56) References Cited

U.S. PATENT DOCUMENTS

| | | | |
|---|---|---|---|
| 6,839,287 B2 | 1/2005 | Brucklmayr et al. | |
| 7,634,688 B2* | 12/2009 | Madter et al. | 714/24 |
| 7,911,836 B2 | 3/2011 | Zilberman | |
| 7,941,692 B2* | 5/2011 | Royer et al. | 714/6.1 |
| 8,132,045 B2 | 3/2012 | Avila et al. | |
| 8,289,801 B2* | 10/2012 | Smith et al. | 365/228 |
| 8,527,693 B2* | 9/2013 | Flynn et al. | 711/103 |
| 2006/0072369 A1* | 4/2006 | Madter et al. | 365/232 |
| 2007/0198796 A1* | 8/2007 | Warren, Jr. | 711/165 |
| 2010/0235570 A1 | 9/2010 | Tsai et al. | |
| 2013/0039141 A1* | 2/2013 | Smith et al. | 365/228 |

* cited by examiner

*Primary Examiner* — Nadeem Iqbal (57) ABSTRACT

A data storage subsystem is disclosed that implements a solid-state data buffering scheme. Prior to completion of programming in solid-state storage media, data that is formatted for storage in solid-state media is maintained in one or more buffers. The system is able to retry failed programming operations directly from the buffers, rather than reprocessing the data. The relevant programming pipeline may therefore be preserved by skipping over a failed write operation and reprocessing the data at the end of the current pipeline processing cycle.

15 Claims, 5 Drawing Sheets

EFFICIENT RETRY MECHANISM FOR SOLID-STATE MEMORY FAILURES

BACKGROUND

1. Technical Field

This disclosure relates to data storage devices. More particularly, the disclosure relates to systems and methods for reprocessing failed write operations to solid-state memory within data storage devices.

2. Description of the Related Art

Programming a solid-state memory device, such as a flash device, may involve a number of processing steps for formatting the data to be saved into the appropriate format for solid-state storage. When a programming operation fails, failed programming blocks may need to be resubmitted, which can interrupt the data pipeline and cause significant delays. In certain circumstances, such as when a power loss event occurs, delays in write time can be particularly concerning due to the limited available power to complete such operations.

BRIEF DESCRIPTION OF THE DRAWINGS

Systems and methods that embody the various features of the invention will now be described with reference to the following drawings, in which.

DETAILED DESCRIPTION OF SPECIFIC EMBODIMENTS

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

DEFINITIONS

As used herein, "non-volatile memory" may refer to solid-state memory such as NAND flash. However, the systems and methods of this disclosure may also be useful in more conventional hard drives and hybrid drives including both solid-state and hard drive components. Although solid-state memory modules described herein are often discussed in the context of flash memory, it should be understood that such memory modules may comprise any suitable solid-state technology, including, but not limited to, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), or other discrete NVM (non-volatile memory) chips. The solid-state storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

As used herein, a "segment" refers broadly to any partition, division, or portion of a whole. Segments may or may not be of equal size and the size of each segment may vary over time. The term "page" is used herein according to its broad and ordinary meaning, and may include, among other things, a portion, segment, or block of a storage array or storage device. Although certain embodiments may be described in the context of "pages," embodiments of systems and methods disclosed herein may be implemented with respect to any partition, division, or portion of a whole. Therefore, reference to the copying or reading of a page or block should be understood to also potentially apply to the copying or reading of any logical or physical unit of memory.

Overview

To improve performance, a data storage device such as a hard disk drive (HDD) may employ a volatile memory such as DRAM to temporarily cache write data to be written to the magnetic media. However, when a power interruption occurs, the contents in the volatile memory must be saved (flushed) to non-volatile memory (e.g., flash memory) to protect user data. This process may be referred to as DRAM egress. When this occurs, a flash-processing module may receive the user data and perform various processing steps in order to output flash-compatible data. For example, the user data may be divided into flash blocks and have protection information associated with the data block. Furthermore, it may be desirable to check protection/coding information at various stages of processing to ensure data reliability. Therefore, the flash processing module may be configured to check user data block coding, divide data into flash-compatible data blocks, and/or generate flash coding for the data.

During processing of write data to flash memory, it is possible for the write to fail or timeout due to a device or page failure. This may be detected as a timeout for the device programming operation or by some other mechanism. A failure to program a flash data block, which may include flash data as well as flash coding, may require resubmitting the data blocks that were part of the that flash data block. In certain systems, when resubmitting the data, it may be necessary for the entire user data block(s) associated with the failed flash block to be processed in order to properly check the coding in the user data block(s). As a result, it may be necessary to reformat the user data, including checking the coding for reliability, breaking the request up into chunks suitable for the flash device(s), and adding the appropriate coding for data reliability on the flash medium. In certain embodiments, performance of such formatting must be completed within a fixed amount of time, particularly if it is executing during system power loss. Therefore, any inefficiency of processing introduced by data resubmission may be problematic with respect to limited-power operation.

In certain embodiments, a flash block/page may include one or more user data blocks, or partial user data blocks. Regenerating a failed page may require resubmitting the entire set of whole user data blocks associated with that page even if only a portion of a user data blocks was part of that page. Such resubmission of the entire user data block may be required in order to check the coding of the user data block(s)

again to ensure data reliability. This may result in inefficiency during the programming operation for at least the following reasons: (1) pipeline interruption may be problematic in DRAM egress situations due to time criticality; (2) calculation of reverse mapping information may be required to locate the user data blocks associated with the failed flash block; and (3) more data than what was required to resubmit the request may be required to be processed due to having to maintain the existing programming pipeline and store additional data associated with remapping, parity data, etc.

In some embodiments of the present invention, a data storage system is configured to maintain buffering of flash pages whose data has not completed programming so that on page failure the data can be re-programmed with minimal processing. As described above, such functionality may be particularly important in an environment where power loss has occurred and the flash is being used to save critical data in a very limited amount of time/power.

A flash application may be used to preserve critical data during power loss, such as data associated with storage system utilities. Therefore, it may be desirable or necessary for a system implementing flash programming to account for the possibility of page failure and the time it takes to recover from such a failure. Generally, the allocation for the amount of data that can be preserved during power loss must be reduced to account for some amount of error handling due to page failures. By optimizing the resubmission process during a failure to program the page, embodiments disclosed herein allow a potentially larger amount of data to be preserved with the same amount of reliability.

Certain embodiments disclosed herein provide reduced overall programming time impact due to error by preserving the programming pipeline. Furthermore, the overhead needed to reconstruct the flash data on failure may also be reduced or eliminated. Therefore, the various embodiments described in this disclosure increase the efficiency of retrying flash pages that have failed, such efficiency often being critical in data storage devices such as HDDs when write data is cached in volatile memory.

System Overview

The systems and devices described herein may comprise various hardware and firmware techniques for retrying failed non-volatile solid-state (e.g., flash) data writes. The various systems and methods may provide improved latency and retry behavior for flash programming for DRAM egress procedures.

Figure 1:
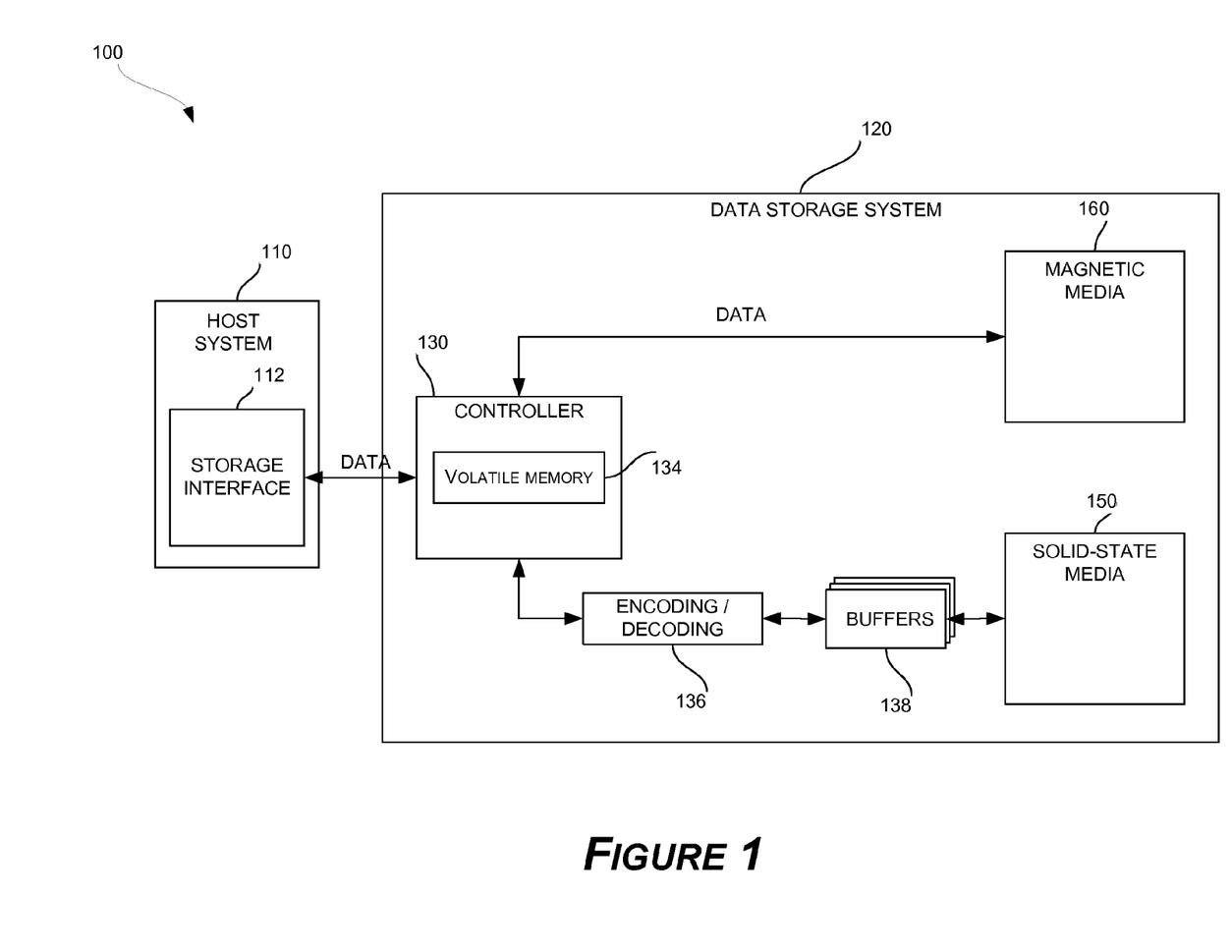
FIG. 1 is a block diagram illustrating an embodiment of a storage system that implements solid-state memory buffering in accordance with one embodiment of the present disclosure.

FIG. 1 is a block diagram illustrating a storage system that implements solid-state (e.g., flash) memory buffering in accordance with one embodiment of the invention. As shown, a data storage system 120 includes a number of components. The storage system 120 includes a controller 130 and a magnetic media module 160, which may comprise a magnetic disk. Where the storage system 120 is a standard HDD, most if not all of the user data received from the host system may be configured to be stored in the magnetic media 160. In a hybrid application, some user data may be stored in a solid-state media 150.

The controller 130 can be configured to receive data and/or storage access commands from a storage interface module 112 (e.g., a device driver) in a host system 110. Storage access commands communicated by the storage interface 112 can include read and write commands issued by the host system 110. Read and write commands can specify a logical block address in the storage system 120. The controller 130 can execute the received commands in the solid-state and/or magnetic media modules. In one embodiment, the controller can include a volatile memory module 134 (e.g., DRAM) for temporarily storing data (e.g., for caching writes to the magnetic media 160).

The data storage system 120 in one embodiment includes a solid-state media module 150, which may be implemented using NAND flash memory devices. Other types of solid-state memory devices can alternatively be used. In certain embodiments, the memory devices are MLC devices, SLC memory devices, or a combination of SLC and MLC devices. Data stored in the volatile memory module 134 may be flushed to the solid-state media module 150 in the event of a power interruption.

The storage system 120 can store data communicated by the host system 110. That is, the storage system 120 can act as memory storage for the host system 110. To facilitate this function, the controller 130 can implement a logical interface that can present to the host system 110 the storage system's 120 memory as a set of logical addresses (e.g., contiguous address) where data can be stored. Internally, the controller 130 can map logical addresses to various physical memory addresses in the magnetic media 160 and/or the solid-state media 150.

With continued reference to FIG. 1, the storage system 120 is in communication with the host 110 through the storage interface 112. The interface 112 provides a communications pathway between the host device 110 and the storage system 120, and can implement any method of communication as known in the art, such as SATA, SAS, USB, Firewire and other communication methods. The controller 130 may be responsible for receiving and processing commands from the host 110 as well as internal commands. Functions of the controller 130 can be implemented in hardware and/or software on a processor and can be located in one or a plurality of physical components according to the designer's preference. In one embodiment, the controller 130 includes a volatile memory unit 134, such as DRAM, that stores one or more system tables and/or system data to support operation of the controller 130.

In one embodiment, the controller 130 manages the storing and/or loading of system data. Data maintained in volatile memory may be lost during a power failure event. Therefore, it may be desirable for the controller 130 to copy (or "flush") certain information contained in the volatile memory module 134 to non-volatile storage, such as the solid-state media module 150. In certain embodiments, system data may be stored on the non-volatile storage module device 150.

The data storage system 120 further includes an encoding and/or decoding module 136 for coding and or encoding user data for storage in the solid-state media module 150. The encoding/decoding module is disposed in the data path between the volatile memory module 134 and the solid-state media module 150. The system 100 further includes one or more buffers 138 for temporarily storing flash data until programming of such data succeeds. If programming fails, the flash blocks that correspond to the failed programming operation are preserved until written again. In certain embodiments, when a page programming error occurs, the flash block that failed is resubmitted directly from one of the stored buffers, thereby providing improved efficiency. As described herein, direct resubmission of failed blocks from flash buffers may involve resubmission of the current pipeline only, or the entire programming pipeline job. The buffering of the flash blocks may also allow for preservation of the programming pipeline by skipping over the failed write and reprocessing at the end of the current pipeline processing cycle. In certain embodiments, remapping and re-writing can be deferred to the end or until multiple programming pipelines have completed.

Egress Processes

Figure 2:
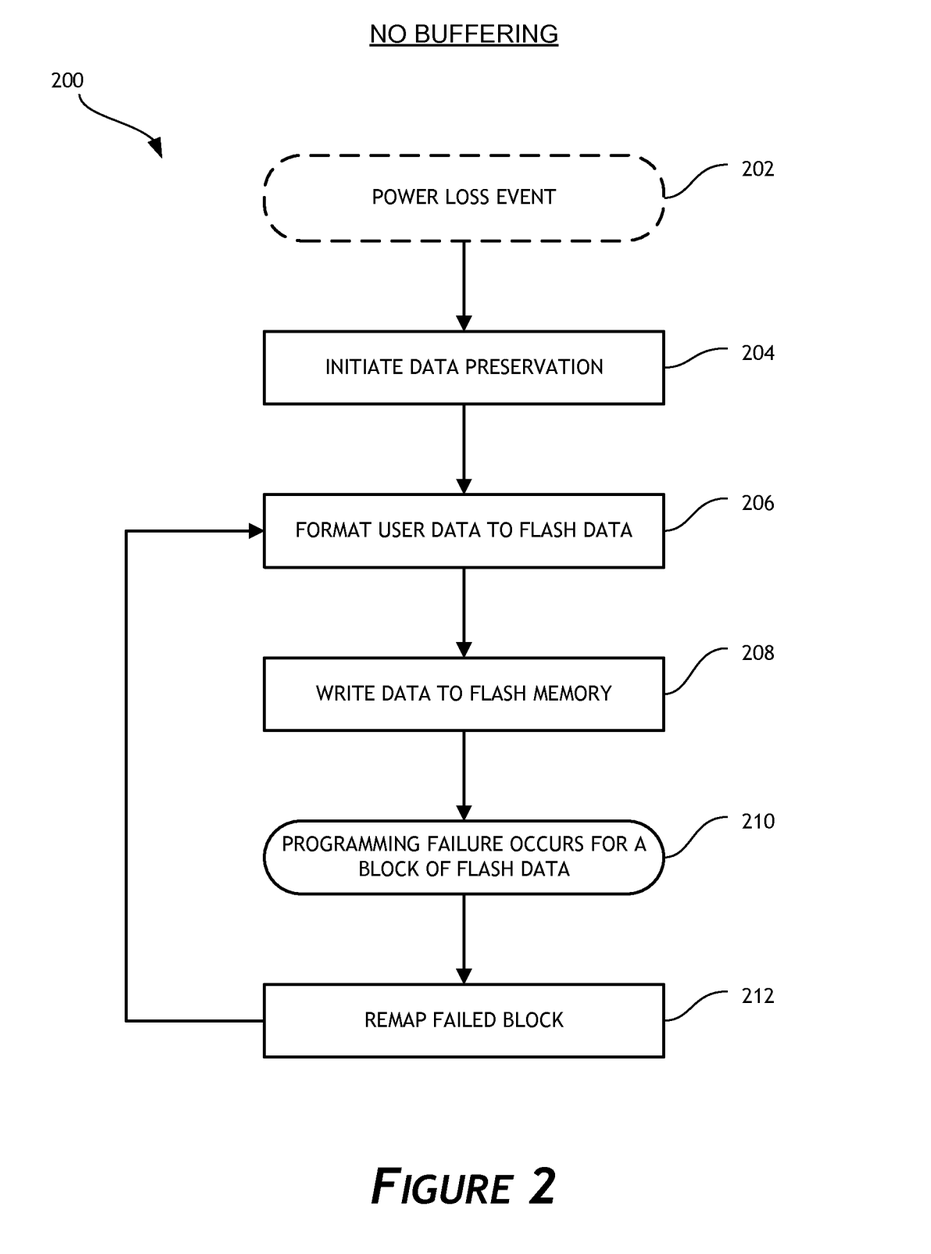
FIG. 2 illustrates a flowchart of an embodiment of a process for resubmitting failed programming blocks in a solid state memory array according to one embodiment of the present disclosure.

FIG. 2 illustrates a flowchart of a process 200 for resubmitting failed programming blocks to a solid state memory array (e.g., flash memory). The process 200 may be implemented in a storage system that does not utilize flash memory buffers 138 for retrying failed programming blocks, as described above in connection with FIG. 1. The process 200 may begin with the occurrence of a data storage system power loss event, as shown at block 202. When a power loss event occurs, it may be necessary or desirable to initiate data preservation procedures (block 204) in order to prevent data stored in volatile memory from being lost as a result of the power failure. In certain embodiments, an amount of user data stored in volatile memory may be transferred to storage in one or more flash memory arrays. In order to complete such storage, at block 206, the user data is formatted to comply with flash storage requirements. Once formatted, the data may be sent for storage in non-volatile flash memory (block 410).

Formatting the host data may require data encoding, decoding, and/or other formatting in order to store at least a portion of the data in one or more flash devices. For example, formatting may include checking coding of the user data to ensure reliability of the data. User data may additionally be broken up or consolidated into blocks of data to be stored in the flash media. Formatting of the data for storage in flash media may further include adding coding for data reliability in the flash media (e.g., ECC).

After the data has been formatted for storage on the flash media, it may be written to one or more flash memory devices (block 208). However, as discussed above, write operations to a memory device may fail under certain circumstances. The process 200 includes handling of a programming failure that may occur in connection with an attempted write to flash media, as shown at block 210. When a programming failure occurs, the process 200 may include remapping the portion of solid-state storage that corresponds to the failure. Such remapping may decrease the likelihood of repeated failure.

Furthermore, subsequent to occurrence of programming failure, the process 200 returns to block 204, where the user data associated with the failure is resubmitted to the flash processor. In certain embodiments, it is necessary to resubmit the entire set of whole user data blocks associated with that page or other pages even if only a portion of a user data block was part of the page. Therefore, the steps at blocks 204-210 must be redone, potentially creating inefficiency. The process 200 may be performed by the controller 130 of the data storage system 120 of FIG. 1.

Figure 3:
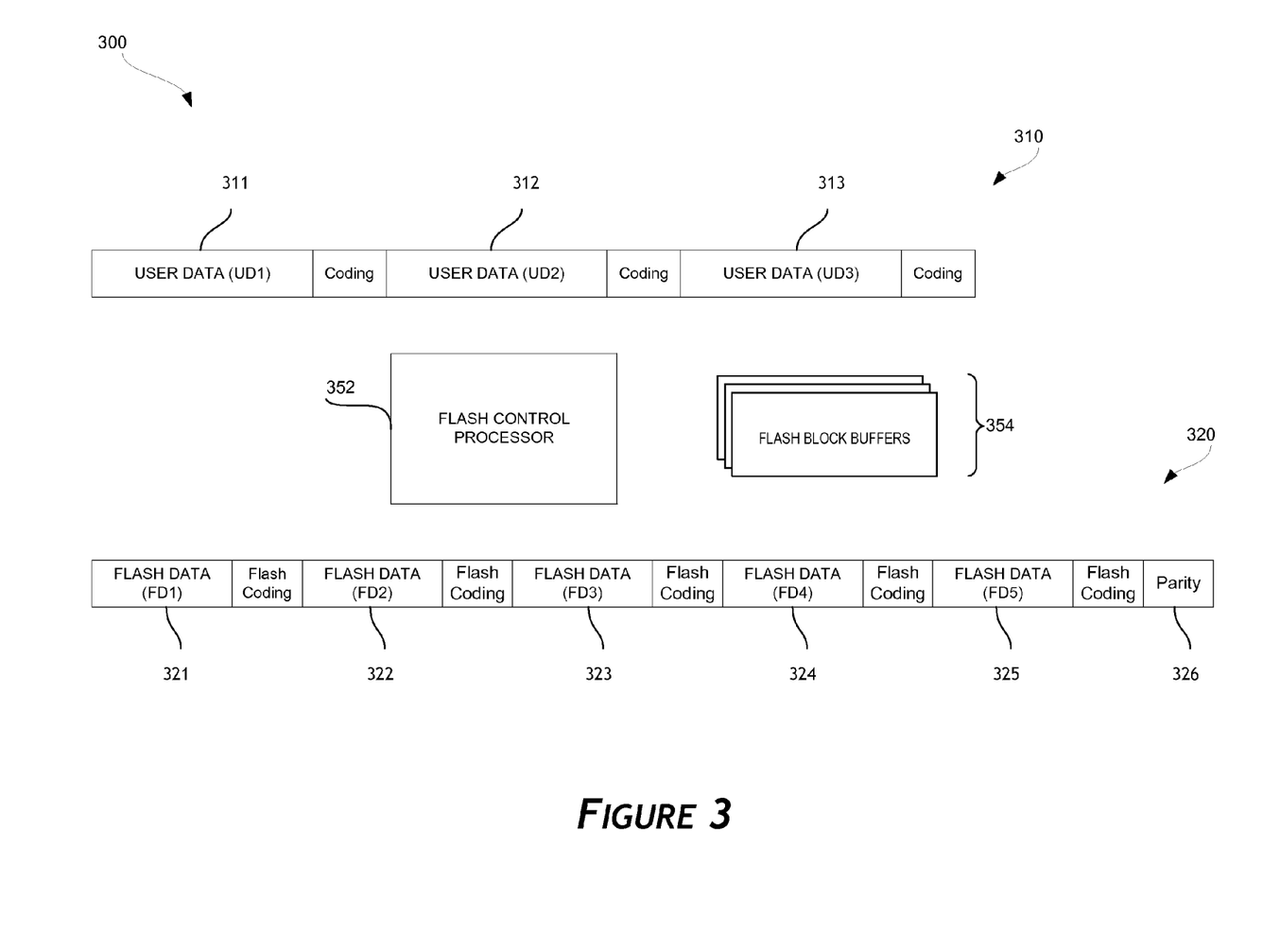
FIG. 3 illustrates a block diagram relating to an embodiment of a data pipeline for storing user data in a solid-state memory array.

FIG. 3 illustrates a block diagram relating to an embodiment of a data storage system 300 configured to process a data pipeline for storing user data in flash memory in accordance with one or more embodiments disclosed herein. The system 300 includes a memory array 310 (e.g., DRAM array) including user data, wherein the user data (e.g., UD1 311, UD2, 312, UD3 313) is processed by a flash control processor 352. The flash control processor 352 may comprise one or more of the functional elements illustrated in FIG. 1, such as the encoding/decoding module 136, and/or some or all of the functionality provided by the controller 130. When DRAM egress is performed, the user data is to be re-formatted and saved into the flash array 320.

As shown in the figure, user data may be broken up into units, or blocks 311, 312, 313. The blocks of user data may be at least temporarily stored in a volatile memory array, such as one or more DRAM arrays. In certain embodiments, each block of user data includes or corresponds to coding data, as shown. When user data is transferred from volatile memory to flash memory, it may be necessary to first format the data in accordance with flash memory configurations. Therefore, the system 300 may include a flash control processor 352 that is configured to perform processing on the user data so that it may be stored in flash memory. For example, the flash control processor may be configured to process the user data, check associated coding for reliability, break the data up into chunks suitable for flash devices (e.g., FD1 321, FD2 322, and so on), and add appropriate coding for data reliability in the flash media, among possibly other things. Parity data may also be stored in the flash memory array 320. For example, the page of parity data 326 may include parity data associated with one or more blocks of flash data stored in the array 320.

Once processed, the flash control processor 352 provides the data to one or more flash block buffers 354, where it is stored at least temporarily. The formatted data is then sent for storage in a portion of a flash memory array 320 that is distinct from the flash block buffers 354. The data is sent as blocks of flash data with associated flash coding, as shown. When a write operation to the flash memory array 320 fails, the flow of the data pipeline may be preserved by resubmitting to the flash the buffered copy of the data associated with the failure in the flash block buffers 354. This re-submission may occur anytime after the current pipeline processing cycle is completed, such that previously performed processing/coding need not be repeated. This speeds up the overall egress operation, which as mentioned above, is time-critical because it occurs when the overall data storage system is experiencing a power loss event and running on limited backup power.

Figure 4:
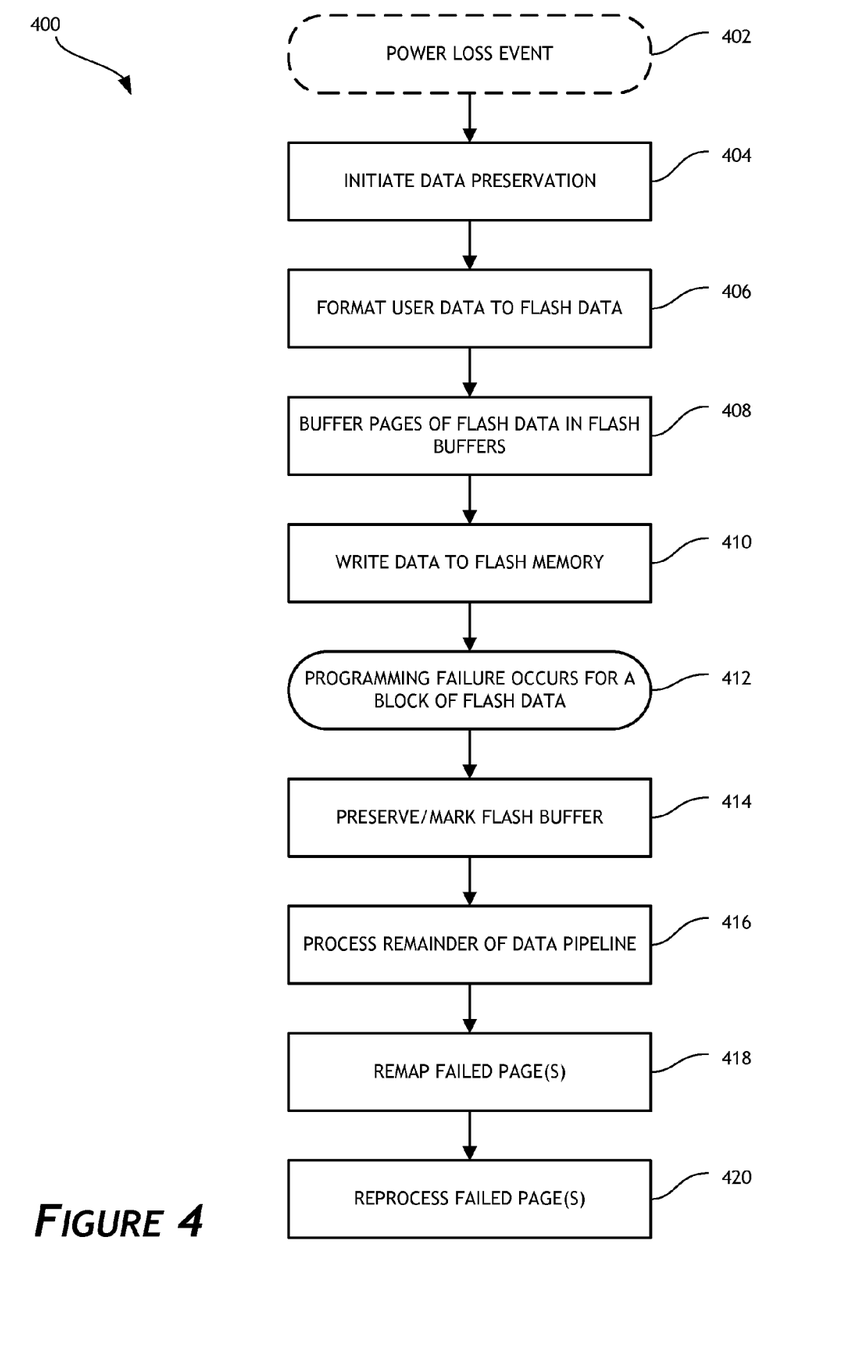
FIG. 4 illustrates a flowchart of an embodiment of a process for buffering pages of data for efficient resubmission of such data following a page failure.

FIG. 4 illustrates a flowchart of an embodiment of a process for buffering pages of data for efficient resubmission of such data in response to a page failure. As shown, the process 400 may begin with the occurrence of a data storage system power loss event, as shown at block 402. When a power loss event occurs, it may be necessary or desirable to initiate data preservation procedures (block 404) in order to prevent data stored in volatile memory from being lost as a result of the power failure. In certain embodiments, an amount of user data stored in volatile memory may be transferred to storage in one or more flash memory arrays. In order to complete such storage, at block 406, the user data is formatted to comply with flash storage requirements. Once formatted, the data may be sent for storage in non-volatile flash memory (block 410). In addition, the data may be stored in one or more flash buffers (block 408), as described above.

In storing the data in the flash memory, programming failure may occur for one or more blocks of data. When such failure occurs (block 412), buffered data associated with the failed data is preserved in one or more flash buffers, such that the failed data may be reprocessed, at block 416, directly from the flash buffers, and need not be resubmitted for processing/formatting by the flash processor. Subsequent to the occurrence of a programming failure at block 412, flash buffer may be marked or otherwise preserved for future reprocessing (block 414). Furthermore, the remainder of the current data pipeline may be processed prior to re-processing the failed page or pages (block 416). Therefore, the data pipeline may be preserved, and, as described above, the failed data may be reprogrammed directly from the flash buffers. The process 400 may further include remapping the failed page or pages in a system table in order to reduce the likelihood of recurring programming failure. Such remapping is performed at block 418. The failed pages may then be reprocessed directly from the flash buffers (block 420). The process 400 may be performed by the controller 130, as described above in connection with FIG. 1.

Flash Buffer Configuration

Figure 5:
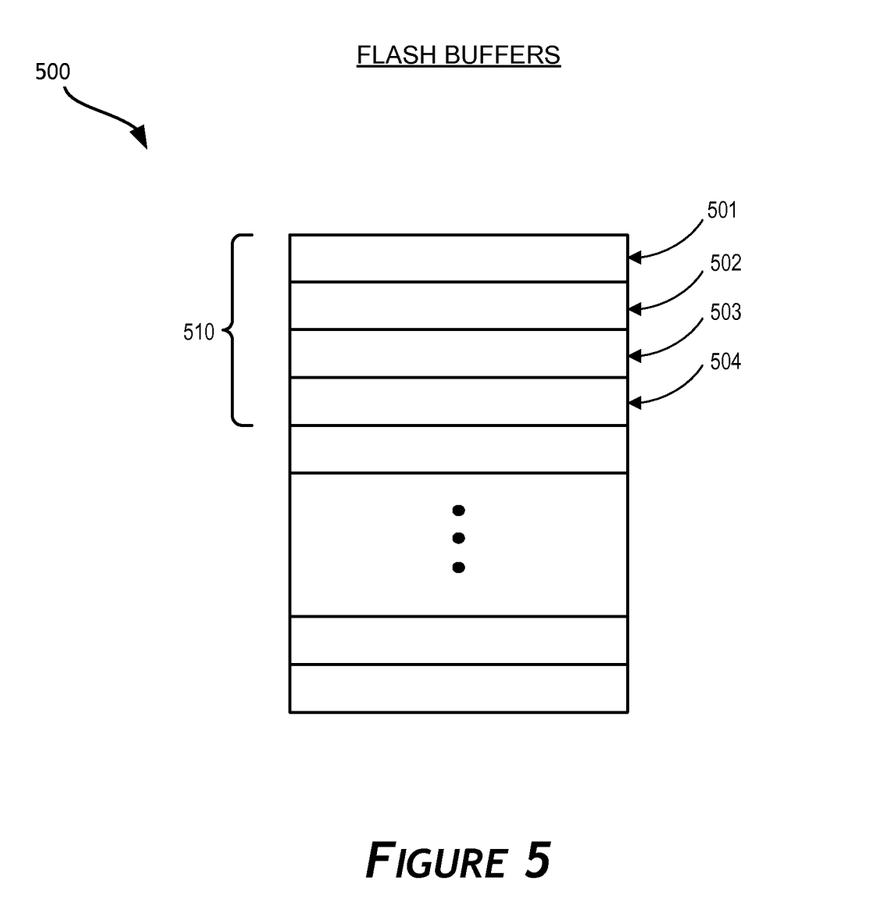
FIG. 5 illustrates an embodiment of a solid-state memory array for buffering pages of data.

FIG. 5 illustrates an embodiment of a memory array 500 for buffering pages of flash data. In certain embodiments, at least a portion 510 of the memory array 500 is designated for flash data buffering. The buffer 510 may comprise a plurality of physical memory locations or pages (501-504). The pages designated for flash buffering may be contiguously positioned in the memory array 500. In certain embodiments, the buffer 510 comprises at least as many pages or units of memory as there are parallel operational paths in the data pipeline. For example, if the relevant data pipeline comprises four paths (e.g., four parallel channels to the solid-state media flash memory 150), then the buffer 510 may be at least four pages in length. It may be desirable to include such number of pages in the buffer 510 in order to provide adequate buffer slots to accommodate each of the operational paths of the data pipeline.

In an example embodiment in which data is formatted and stored in flash memory in four parallel operational data paths, a first data path in the data pipeline that arrives at a stage in which flash data is stored to the buffer 510 may store data processed by such data path in a first page or location 501 of the buffer 510. A second data path may store flash data in a second buffer location 502, and likewise in order for third and fourth data paths. In certain embodiments, data stored in the flash buffer 510 is stored in a circular fashion, such that data is preserved in the buffer until the remaining locations of the buffer are subsequently programmed, or until it is confirmed that the data has been successfully written to flash, after which the data may be overwritten. For example, after a first page of flash data is stored in a first location 501, such data may be successfully stored in a destination flash memory array. After subsequent blocks of data are stored in the remaining locations of the flash buffer, the first location 501 may be reallocated for storage of another block of flash data until such data is successfully programmed.

In certain embodiments, it may be desirable to allow flash data to be preserved in the buffer until data has been successfully written to flash memory. Therefore, it may be desirable to transfer the buffered data to a separate location when it is determined that a write operation to write the data to flash memory has failed, and the data must be resubmitted to the flash memory. For example, when a programming failure occurs, buffered data associated with the failure may be copied to a new location so that the previously occupied buffer page may be reallocated. The failed data may be reprogrammed directly from the new location at the conclusion of the current data pipeline. In another embodiment, the data is allowed to reside at its original location until successfully stored. In such embodiments, it may be necessary or desirable to either reduce the number of parallel operating paths of the data pipeline, or increase or adjust the range of memory locations spanned by the buffer 510, in response to programming failure.

CONCLUSION

The present disclosure describes systems and methods for reprogramming failed write operations to flash memory. During processing of write data to flash memory, it is possible for the write to fail or timeout due to a device or page failure. A failure to program a flash data block may require resubmitting the entire user data block(s) associated with the failed flash block to be reformatted for flash storage, which may lead to inefficiency. Such inefficiency of processing introduced by data resubmission may be problematic with respect to limited-power operation, such as when a system power loss event occurs.

In some embodiments of the present invention, a data storage system is configured to maintain buffering of flash pages whose data has not completed programming so that on page failure the data can be re-programmed with minimal processing. Such functionality may be particularly important in an environment where power loss has occurred and the flash is being used to save critical data in a very limited amount of time/power. Various embodiments disclosed herein provide improved performance of writes during a failure condition in flash memory.

OTHER VARIATIONS

As used in this application, "non-volatile memory" typically refers to solid-state memory such as, but not limited to, NAND flash. However, the systems and methods of this disclosure may also be useful in more conventional hard drives and hybrid hard drives including both solid-state and hard drive components. The solid-state storage devices (e.g., dies) may be physically divided into planes, blocks, pages, and sectors, as is known in the art. Other forms of storage (e.g., battery backed-up volatile DRAM or SRAM devices, magnetic disk drives, etc.) may additionally or alternatively be used.

Those skilled in the art will appreciate that in some embodiments, other types of flash buffering can be implemented. In addition, the actual steps taken in the processes shown in FIGS. 2 and 4 may differ from those shown in the figures. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage system comprising:
a first volatile memory;
a second volatile memory;
a first non-volatile memory; and
a controller configured to:
upon detection of a power failure, preserve data in the first volatile memory by:

dividing one or more logical units of data in the first volatile memory into a plurality of data blocks in accordance with a storage format of the first non-volatile memory;

encoding the plurality of data blocks in accordance with the format;

storing the encoded data blocks in the second volatile memory;

submitting the encoded data blocks for storage in the first non-volatile memory; and when an encoded data block encounters a storage failure in the first non-volatile memory, marking the failed data block in the second volatile memory for re-submission to the first non-volatile memory after completion of a current programming pipeline;

wherein the re-submission is performed without encoding another data block that corresponds to a common logical unit of data as the encoded data block that encountered the storage failure.

2. The data storage system of claim 1 further comprising a second non-volatile memory, wherein the first volatile memory serves as a buffer for the second non-volatile memory during normal operation of the system.

3. The data storage system of claim 2, wherein the second non-volatile memory is a rotating magnetic media.

4. The data storage system of claim 1, wherein the first volatile memory is used to store power-safe data for at least one internal process.

5. The data storage system of claim 1, wherein the controller is further configured to:
after the failed data block is resubmitted:
confirm that storage of the encoded data blocks in the non-volatile memory was successful; and
reuse a portion of the second volatile memory after confirming successful storage.

6. The data storage system of claim 1, wherein the controller is further configured to submit data blocks to multiple non-volatile memory channels in parallel.

7. The data storage system of claim 1, wherein the one or more logical units of data in the first volatile memory each comprise a data portion and a coding portion.

8. The data storage system of claim 1, wherein the controller is configured to allocate a maximum amount of data that may be stored in the first non-volatile memory following power loss.

9. The data storage system of claim 1, wherein the first non-volatile memory comprises portions of a plurality of separate solid-state memory devices.

10. A method of reprogramming failed data writes to non-volatile memory, the method comprising:
detecting a power failure in a data storage system; and
in response to detecting the power failure:
dividing one or more logical units of data in a first volatile memory into a plurality of data blocks in accordance with a storage format of a first non-volatile memory;
encoding the plurality of data blocks in accordance with the format;
storing the encoded data blocks in a second volatile memory;
submitting the encoded data blocks for storage in the first non-volatile memory; and
in response to an encoded data block encountering a storage failure in the first non-volatile memory, marking the failed data block in the second volatile memory for re-submission to the first non-volatile memory after completion of a current programming pipeline;
wherein the re-submission is performed without encoding another data block that corresponds to a common logical unit of data as the encoded data block that encountered the storage failure.

11. The method of claim 10, further comprising:
confirming that the encoded data blocks were successfully stored in the non-volatile memory was successful; and
reusing a portion of the second volatile memory after confirming successful storage.

12. The method of claim 10, wherein encoding the plurality of data blocks comprises:
determining whether coding data of the plurality of data blocks is valid; and
generating solid-state coding data associated with the plurality of data blocks.

13. The method of claim 12, wherein dividing the one or more logical units of data into a plurality of data blocks comprises combining multiple blocks of the one or more logical units into a single block of solid-state data.

14. The method of claim 13, wherein dividing the one or more logical units of data into a plurality of data blocks comprises dividing a single block of the one or more logical units into multiple blocks of solid-state data.

15. The method of claim 10, further comprising receiving a timeout signal or an error status from the first non-volatile memory indicating that the encoded data block encountered the storage failure.

* * * * *